(12) United States Patent
Kawashima

(10) Patent No.: US 6,357,904 B1
(45) Date of Patent: Mar. 19, 2002

(54) LINEAR ILLUMINATION DEVICE

(75) Inventor: Shingo Kawashima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/548,150

(22) Filed: Apr. 13, 2000

(30) Foreign Application Priority Data

Apr. 19, 1999 (JP) .......................................... 11-110980

(51) Int. Cl.⁷ .............................. G02B 6/42; H01L 33/00
(52) U.S. Cl. ...................... 362/555; 362/31; 362/231; 362/243; 362/84; 362/247; 362/800
(58) Field of Search ................. 362/26, 27, 31, 362/228, 230, 231, 242, 243, 84, 247, 551, 555, 800

(56) References Cited

U.S. PATENT DOCUMENTS 5,396,406 A * 3/1995 Ketchpel ..................... 362/27
5,709,453 A * 1/1998 Krent et al. .................. 362/31
5,810,463 A * 9/1998 Kawahara et al. ............ 362/31
6,139,174 A * 10/2000 Butterworth ................ 362/231

FOREIGN PATENT DOCUMENTS

JP        10-56577        2/1998

* cited by examiner

*Primary Examiner*—Alan Cariaso

(57) ABSTRACT

A linear illumination device includes a thin and long rectangular parallelepiped optical waveguide member for linearly diffusing light and has a basic construction, which uses a red color light emitting LED as a red color light source provided on a light incident surface of the optical waveguide member and an organic EL element capable of emitting blue color light as a blue color light source. An LED or an organic EL element is used as a green color light source. The organic EL element or elements are arranged such that they reflect back the light emitted from the LED and introduced into the optical waveguide member. An area of a rear electrode of the organic EL element is determined such that the rear electrode covers an upper surface and side surfaces of the optical waveguide member.

17 Claims, 4 Drawing Sheets

LINEAR ILLUMINATION DEVICE

BACKGROUND OF THE INVENTION

1. Field of the Invention

The present invention relates to a linear illumination device and, particularly, to a linear illumination device suitable for use as a light source of a contact type color image sensor.

2. Description of the Prior Art

Japanese Patent Application Laid-open No. H10-56577 discloses a construction of a conventional long linear illumination device for a color image sensor, which is schematically shown in FIG. 1. In FIG. 1, in order to obtain a color signal corresponding to an image of an original 9, each identical portion of the original is illuminated with a red (R), green (G) and blue (B) lights from R, G and B color light emitting diodes (LED's) while switching these LED's by a switch circuit 60 with a light emitting timing shown in FIG. 2.

That is, LED's 21, 22 and 23 corresponding to R, G and B color lights, respectively, are arranged on an end surface of an optical waveguide member 11 and emit an illumination light 45 containing R, G and B color lights downward by guiding them through the optical waveguide member 11 while scattering them suitably. The original 9 disposed below the optical waveguide member 11 is illuminated with the illumination light 45 and a reflection light 47 reflected from the surface of the original 9 is incident on an image sensor 50, which is composed of a sensor array, through an optical system, etc., which is not shown. The image sensor 50 converts each color light into an electric signal with a light-electric conversion timing as shown in the bottom of FIG. 2, so that an electric color information for every scan line of the original is obtained.

In the disclosed prior art construction, in which three LED's are arranged in the end face of the optical waveguide member 11, however, it is very difficult to design an optical system capable of uniformly illuminating the original with lights having different wavelengths, so that the utilization efficiency of light is lowered.

Further, since the reliability of the blue color light emitting LED is not sufficient at present and the supply thereof is not enough, the cost of the blue LED becomes very high. Consequently, the cost of the linear illumination device itself becomes high.

SUMMARY OF THE INVENTION

An object of the present invention is to provide an inexpensive linear illumination device capable of realizing an improvement of uniformity of a distribution of illumination light in a lengthwise direction of a linear light source thereof.

According to the present invention, a linear illumination device comprises an optical waveguide member for guiding three primary color lights incident on a light incident surface thereof and emitting them from a rectangular linear light emitting surface thereof, a point light source including at least one light emitting diode (referred to as LED, hereinafter), etc., provided on the optical waveguide member for supplying light through the light incident surface of the optical waveguide member into an interior thereof and a surface emitting light source including at least one light emitting element such as organic electro luminescent (referred to as EL, hereinafter) element provided on a surface portion of the optical waveguide member other than the light emitting surface thereof for reflecting back the light emitted from the point light source into the interior of the optical waveguide member.

A rear side electrode, that is a cathode electrode, of the EL element opposite to a transparent electrode, that is, an anode electrode, thereof is constituted with a light-reflecting layer of such as aluminum. An LED is employed as a red color light source and an EL element is employed as a blue color light source. As a green color light source, either LED or EL element is employed.

In a case where an LED for a red color light and two EL elements for a blue and green color lights are used, a linear illumination device is obtained by providing the red color LED on an end face of the optical waveguide member and the two EL elements on an upper surface of the optical waveguide member. Alternatively, it is possible to obtain the linear illumination device by providing a plurality of red color LED's on the upper surface of the optical waveguide member and the two EL elements on respective opposite side surfaces of the optical waveguide member. In a case where a single EL element is used for blue color light, the linear illumination device is obtained by providing a red color LED and a green color LED on the end face of the optical waveguide member and the blue color EL element on the upper surface of the optical waveguide member. Alternatively, it is possible to obtain the linear illumination device by forming a plurality of openings in the blue color EL element provided on the upper surface of the optical waveguide member and arranging the red color LED's and the green color LED's in the openings alternately.

The EL element is preferably an organic thin film EL element including a transparent front electrode as an anode electrode on the side of the optical waveguide member, a metal rear electrode as a cathode electrode, which may be formed of aluminum and has a light reflecting function and an organic thin film light emitting layer provided between the transparent front electrode and the metal rear electrode.

The linear illumination device is constructed such that the point light source and a surface emitting light source emit three primary color lights sequentially. Further, the metal rear electrode of the EL element is formed to cover the upper and side surfaces of the optical waveguide member to thereby effectively reflect light in an interior of the optical waveguide member and guide it to the light emitting surface thereof.

The linear illumination device according to the present invention can use not only EL element but also LED for emitting blue color light. Therefore, it is possible to reduce the cost of linear illumination device when the LED is used as the blue color light source. Further, according to the present invention, LED or LED's and EL element or elements are combined suitably. Therefore, it is possible to employ an inexpensive construction of linear illumination device. Further, since the EL element is a surface light emitting element, it is possible to illuminate a plane to be illuminated with high uniformity.

Further, since the light emitting area of the red color LED, which is a point light source, can be defined to a single point, the design of the optical waveguide member for uniformly diffusing light to a linear light becomes substantially easier compared with the conventional design for uniformly diffusing lights having different wavelengths and the uniformity of illumination can be improved compared with the conventional case.

Further, both the blue and green color lights may be emitted by the EL elements. Therefore, no unevenness of amounts of blue and green color lights occurs due to the rectangular parallelepiped optical waveguide member and a uniform illumination for an original to be illuminated can be obtained. Consequently, the light amount of illumination is uniformed, so that it becomes possible to improve the quality of image taken in by converting a reflected light reflected by the original illuminated by the linear illumination device into an electric signal by an image sensor.

DETAILED DESCRIPTION OF THE PREFERRED EMBODIMENTS

Figure 3:
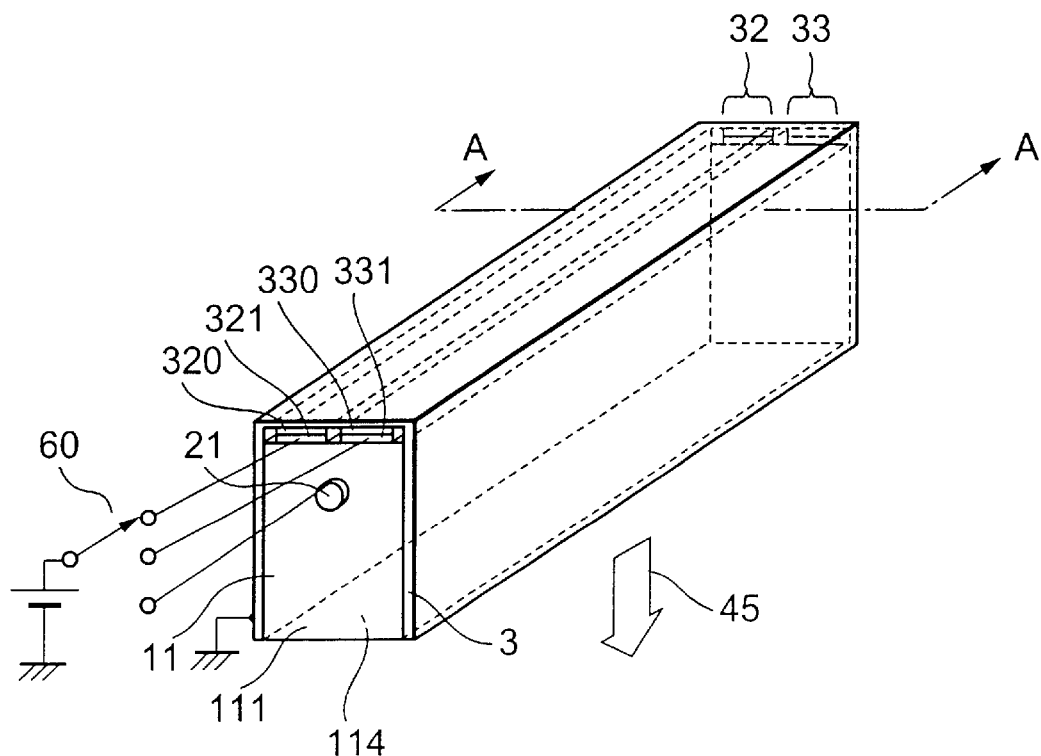
FIG. 3 is a schematic perspective view of an illumination device for a contact type sensor, according to a first embodiment of the present invention.

Referring to FIG. 3 showing a first embodiment of the present invention, an optical waveguide member 11 having a rectangular parallelepiped shape is formed of a transparent material such as transparent glass and has a lower light emitting surface 114 for emitting three primary color lights in a direction shown by an arrow 45. A red color light emitting LED 21 is provided on an end face 111 of the optical waveguide member 11 adjacent to the shorter side of the light emitting face 114 thereof. A rectangular green EL element 32 for emitting green color light and a rectangular blue EL element 33 emitting blue color light are provided in parallel to each other on and along an upper surface of the optical waveguide member 11, as rectangular surface emitting light sources. The LED 21 may be embedded into the end face 111 of the optical waveguide member 11.

The green EL element 32 is constructed with a transparent anode electrode 321 of such as tin-doped indium oxide (referred to as ITO, hereinafter) formed on the upper surface of the optical waveguide member 11, a green light emitting layer 320 formed on the transparent electrode 321 and a metal rear electrode 3 of such as aluminum formed on the green light emitting layer 320 as a cathode. The metal rear electrode 3 functions as a light reflecting film as well. Similarly, the blue EL element 33 is constructed with a transparent anode electrode 331 of such as ITO formed on the upper surface of the optical waveguide member 11, a blue light emitting layer 330 formed on the transparent anode electrode 331 and the metal rear electrode 3, which is formed on the blue light emitting layer 330 and functions as a light reflecting film as well. ConfigGurations of the transparent electrodes 321 and 331 are identical in plane to the respective light emitting layers thereof.

In the shown embodiment, the metal rear electrode 3 functioning as the light reflecting film as well are used commonly for the green and blue EL elements. The light reflecting electrode 3 is larger in plane area than the light emitting layers as well as the transparent electrodes and extends to not only the upper surface of the optical waveguide member 11 but also the longer side surfaces of the light emitting surface 114 thereof such that lights incident to an interior of the optical waveguide member 11 is reflected thereby to efficiently emit the three primary color lights from the light emitting surface 114.

Figure 2:
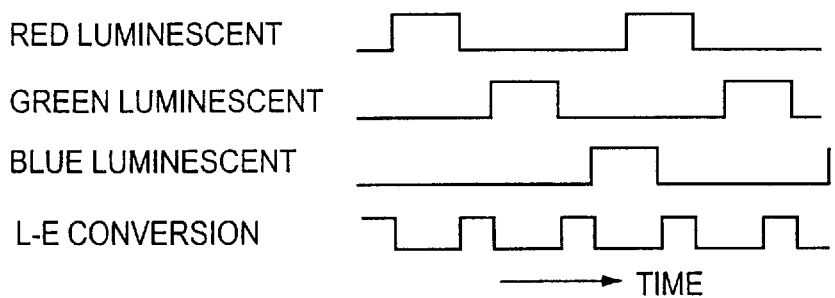
FIG. 2 shows light emitting timings of the three primary colors from the LED's shown in FIG. 1 and a light-electric conversion timing thereof at a light receiving portion thereof.

In the linear illumination device for the contact type sensor, constructed as mentioned above, an application of voltage to the LED 21 and the EL elements 32 and 33 is sequentially switched by a switch circuit 60 according to the light emitting timings shown in FIG. 2 to sequentially emit the three primary R, G and B lights so that the light source switching type color image sensor can be realized.

Either inorganic EL elements or organic EL elements can be used as the EL elements 32 and 33. However, organic EL elements, which can be driven with a low D.C. voltage, are preferable in view of simplicity of the drive circuit design. Although there are various constructions of organic EL element at present, the present invention is not limited to any specific construction of organic EL elements. In the following description, the present invention will be described as using organic EL elements.

Figure 4:
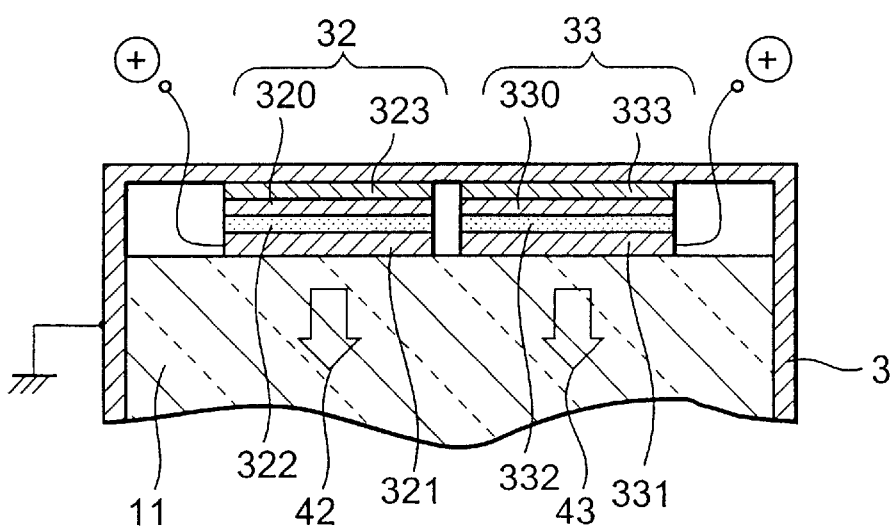
FIG. 4 is an enlarged cross sectional view of the illumination device taken along a line A—A in FIG. 3.

FIG. 4 shows a case where known organic thin film EL elements each having a light emitting layer containing three-layer structure are employed in the linear illumination device having the construction shown in FIG. 3. In FIG. 4, the organic EL element 32 emitting green color light is formed by forming the transparent front electrode 321 on the upper surface of the optical waveguide member 11, forming a hole transporting organic thin film 322 on the transparent electrode 321, forming a green color light emitting organic thin layer 320 on the hole transporting organic thin film 322, forming an electron transporting organic thin layer 323 on the green color light emitting organic thin layer 320 and forming the metal rear electrode 3 functioning as a reflection film, which is used commonly by the organic EL element 33 for emitting blue color light.

Similarly, the organic EL element 33 emitting blue color light is formed by forming the transparent electrode 331 on the upper surface of the optical waveguide member 11, forming a hole transporting organic thin film 322 on the transparent electrode 331, forming a blue color light emitting organic thin layer 330 on the hole transporting organic thin film 332, forming an electron transporting organic thin layer 333 on the blue color light emitting organic thin layer 330 and using the metal rear electrode 3 of the organic EL element 33.

The metal rear electrode 3, which is common for the organic EL elements 32 and 33, is electrically separated from the transparent electrodes 321 and 331. In FIG. 4, a space is provided between the organic EL elements 32 and 33 and spaces are provided between the side faces of the organic EL elements and the metal rear electrode 3, respectively. However, these spaces may be filled with a suitable insulating material.

In the construction shown in FIG. 4, the reflecting electrode 3 of aluminum is used as the cathode electrode applied with ground potential. When a positive voltage is applied to the transparent anode electrodes 321 and 331 of the organic EL elements 32 and 33 and to the red LED 21 with the respective light emitting timings shown in FIG. 2, the organic thin film light emitting layers 320 and 330 and the red LED 21 emit green, blue and red lights sequentially, respectively.

In the linear illumination device for the contact type color image sensor according to the first embodiment of the present invention, in which the organic EL elements 32 and 33 have the constructions shown in FIGS. 3 and 4, the red color light emitted from the LED 21 is reflected by the metal rear electrode 3 of aluminum as a cathode provided on a rear surface of the organic EL elements. That is, the organic EL elements function as a reflection plate when the LED 21 emits red color light. Further, since the respective organic EL elements are surface emitting light sources, it becomes possible to illuminate the original with highly uniform luminance.

As described, according to the first embodiment of the present invention, which comprises the rectangular parallelepiped optical waveguide member 11 for diffusing light linearly, the red color LED 21 provided on the optical waveguide member 11 and the organic EL elements 32 and 33 provided on the upper surface of the optical waveguide member 11 in parallel each other and emitting green and blue color lights, respectively, and the organic EL elements are arranged such that the red color light from the LED 21 in the optical waveguide member 11 is reflected back thereby, it becomes possible to reduce the cost of the linear illumination device, to illuminate the original with lights from the organic EL elements highly uniformly and to substantially facilitate the design of the optical waveguide member compared with the conventional design, to thereby improve the quality of the taken-in image.

Figure 5:
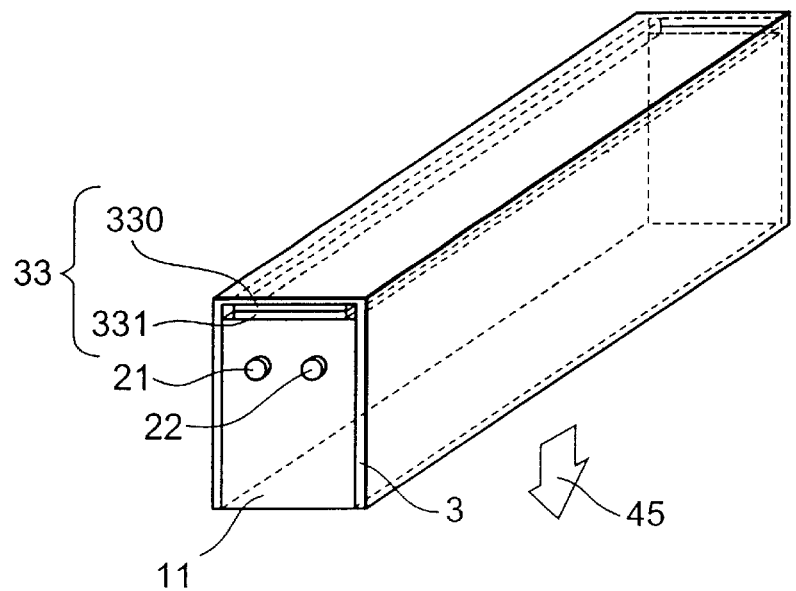
FIG. 5 is a schematic perspective view of an illumination device for a contact type sensor, according to a second embodiment of the present invention.

FIG. 5 shows a linear illumination device for a contact type color image sensor, according to a second embodiment of the present invention. The linear illumination device shown in FIG. 5 employs two LED's as red and green color light emitters and an organic EL element as a blue color light emitter. In FIG. 5, the LED 21 capable of emitting red color light and an LED 22 capable of emitting green color light, which can be independently driven each other, are juxtaposed on one of end faces of an optical waveguide member 11. An organic EL element 33 capable of emitting blue color light is formed on substantially a whole upper surface of the optical waveguide member 11. An output light is emitted from a lower surface of the optical waveguide member 11 in a direction shown by an arrow 45.

The organic EL element 33 capable of emitting blue color light has a similar construction of the organic EL element 33 shown in FIG. 4. That is, the organic EL element 33 of the second embodiment comprises a transparent electrode 331, an organic thin film light emitting layer 330 and a metal rear electrode 3 as a cathode. Incidentally, a light source switching and driving device for these LED's and the organic EL element is not shown since it is similar to that shown in FIG. 3.

In the linear illumination device for the contact type color image sensor according to the second embodiment, the light emitted from either one of the LED's, which is currently driven, is reflected by the metal rear electrode 3 of such as aluminum as the cathode provided on a rear surface of the organic EL element 33 as well. That is, the organic EL element 33 functions as a reflection plate when either one of the LED's emits light. Further, since the organic EL element 33 is a surface-emitting element, it becomes possible to illuminate the original with highly uniform luminance. It should be noted that green light among the three primary color lights can be obtained by an organic EL element instead of the LED.

As described, according to the second embodiment of the present invention, which comprises the LED 22 for emitting green color light arranged on the end face of the rectangular parallelepiped optical waveguide member 11, it becomes possible to reduce the cost of the linear illumination device, to illuminate the original with lights from the organic EL element 33 highly uniformly and to substantially facilitate the design of the optical waveguide member compared with the conventional design, to thereby improve the quality of the taken-in image. Further, the metal rear cathode electrode 23 of aluminum of the organic EL element 33 functions as the reflection plate, providing the same effect as that obtained in the first embodiment.

Figure 6:
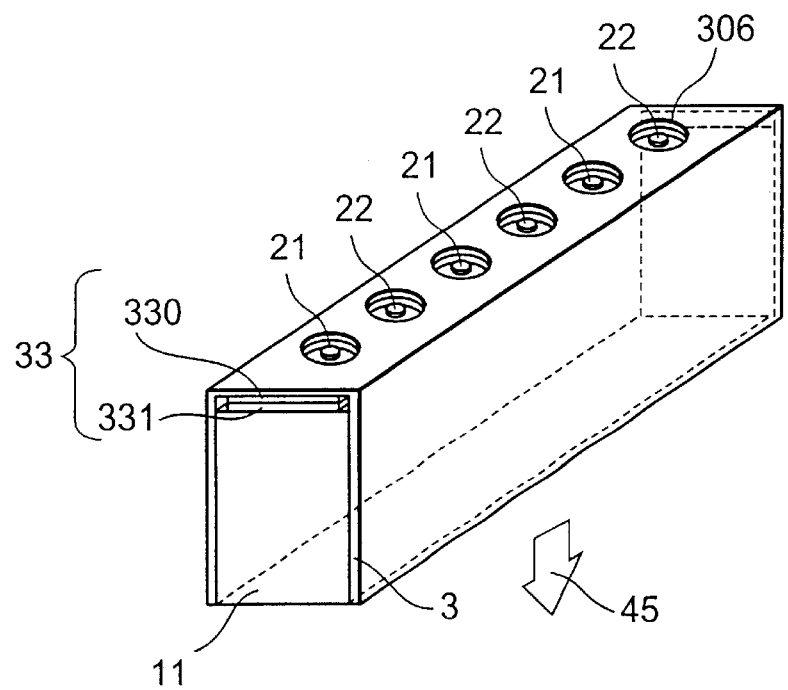
FIG. 6 is a schematic perspective view of an illumination device for a contact type sensor, according to a third embodiment of the present invention.

FIG. 6 shows a linear illumination device for the contact type color image sensor according to a third embodiment of the present invention. In FIG. 6, the linear illumination device comprises an organic EL element 33 for emitting blue color light provided on an upper surface of the rectangular parallelepiped optical waveguide member 11. The organic EL element 33 has a similar construction to that shown in FIG. 5. However, a plurality of openings 306 are formed in a rear side portion of a cathode electrode 3, through which the optical waveguide member 11 is partially exposed.

A plurality of red color light emitting LED's 21 and a plurality of green light emitting LED's 22 are provided in the openings 306, alternately. In this embodiment, six (6) openings 306 are provided equidistantly in a lengthwise direction of the optical waveguide member 11 and three red LED's and three green LED's are arranged in the openings 306 alternately. A light source switching and driving device for these LED's and the EL element is not shown since it is similar to that shown in FIG. 3.

Similarly to the linear illumination device of the described embodiment shown in FIG. 5, the illumination device shown in FIG. 6 illuminates an original by guiding the primary R, G and B color lights emitted from LED's 21 and 22, which emit red and green color light, respectively, and an organic EL element 33, which emits blue color light, through an optical waveguide member 11 to a lower surface thereof and emitting the R, G and B color lights therefrom in a direction shown by an arrow 45. With the use of the lights from LED's 21 and 22, which emit red and green color light, respectively, and an organic EL element 33, which emits blue color light, it is possible to improve the light emitting efficiency of the illumination device and to reduce the cost thereof, as in the case of the second embodiment of the present invention.

Figure 7:
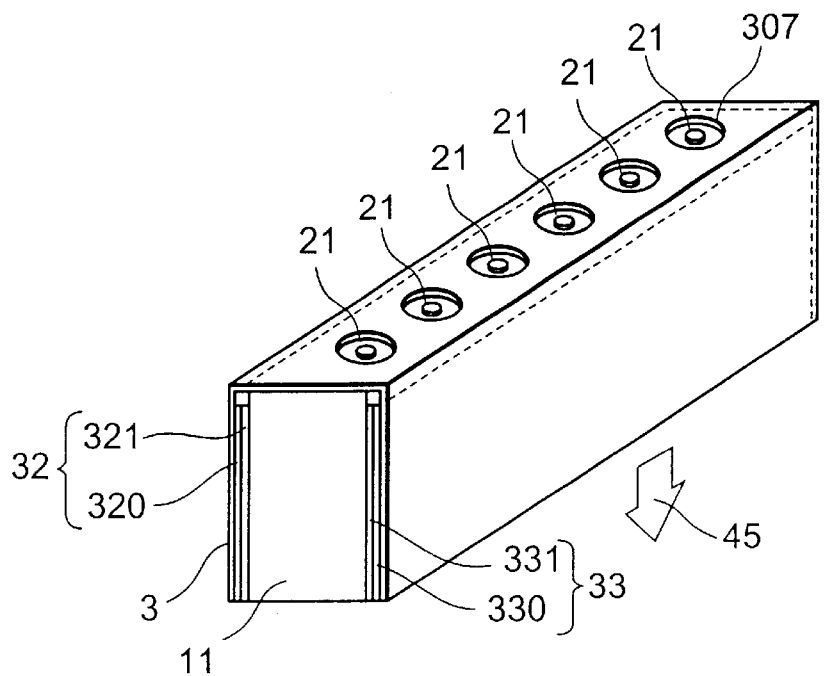
FIG. 7 is a schematic perspective view of an illumination device for a contact type sensor, according to a fourth embodiment of the present invention.

A linear illumination device for a contact type color image sensor according to a fourth embodiment of the present invention will be described with reference to FIG. 7. In FIG. 7, an organic EL element 32 capable of emitting green color light and an organic EL element 33 capable of emitting blue color light are arranged on opposite side surfaces of an optical waveguide member 11 having a rectangular parallelepiped shape, respectively. A plurality of LED's 21 capable of emitting red color light are arranged equidistantly on an upper surface of the optical waveguide member 11. In this embodiment, six (6) openings 307 are formed equidistantly in a portion of a cathode electrode 3 common for the organic EL elements 32 and 33, which abuts the upper surface of the optical waveguide member 11, along a lengthwise direction of the optical waveguide member 11 and the LED's 21 are fixed in the openings 307, respectively. The three primary color lights emitted from the organic EL elements 32 and 33 and the LED's 21 are guided by the optical waveguide member 11 and emitted from a bottom surface thereof in a direction shown by an arrow 45. The organic EL elements 32 and 33 have similar construction to those of the EL elements mentioned previously. That is, the organic EL element 32 for emitting green color light is formed by forming a rectangular transparent anode electrode 321 on one of the side surfaces of the optical waveguide member 11 and forming an organic thin film light emitting layer 320 thereon. Similarly, the organic EL element 33 for emitting blue color light is formed by forming a transparent anode electrode 331 on the other side surface of the optical waveguide member 11 and forming an organic thin film light emitting layer 330 thereon. A cathode electrode 3 of aluminum, which is common for the organic EL elements 32 and 33 and functions as a reflection film as well, is then formed on the light emitting layers 320 and 330.

In the linear illumination device for the contact type color image sensor according to the fourth embodiment, the three primary color lights emitted from the LED's 21 and the paired organic EL elements 32 and 33 are guided by the optical waveguide member 11 and emitted from the lower surface of the optical waveguide member 11 in the direction shown by the arrow 45 to uniformly illuminate the original. By using the LED's 21, which emit red color light, and the organic EL elements 32 and 33, which emit blue and green color lights, respectively, and are arranged oppositely such that these organic EL elements function as reflection films internally reflecting light substantially totally, the improvement of light emitting efficiency and the reduction of cost can be realized. In this case, red lights from the LED's 21 are also totally internally reflected by the organic EL elements 32 and 33 and guided in the direction shown by the arrow 45. A light source switching and driving device for these LED's and the EL elements is not shown since it is similar to that shown in FIG. 3.

As described, according to the fourth embodiment of the present invention, in which the organic EL elements 32 and 33 are arranged on the opposite side surfaces of the rectangular parallelepiped optical waveguide member 11 in order to obtain a required amount of light, it becomes possible to reduce the cost of the linear illumination device, to illuminate the original with lights from the organic EL element 33 highly uniformly and to substantially facilitate the design of the optical waveguide member compared with the conventional design, to thereby improve the quality of the taken-in image as in the case of the first embodiment. Further, since the aluminum cathode electrode 3 common for the organic EL elements 32 and 33 has the function of a reflection plate when these EL elements are not driven, the same effect as that obtained by the first embodiment can be obtained.

Although the fourth embodiment has been described as to the optical waveguide member and the light source material, mainly, the linear illumination device can be used to an information reading in an image scanner or an image reading in a facsimile device. In such case, the linear illumination device may be combined with a line image sensor to make it possible to read an original with high resolution under high illumination condition.

Figure 1:
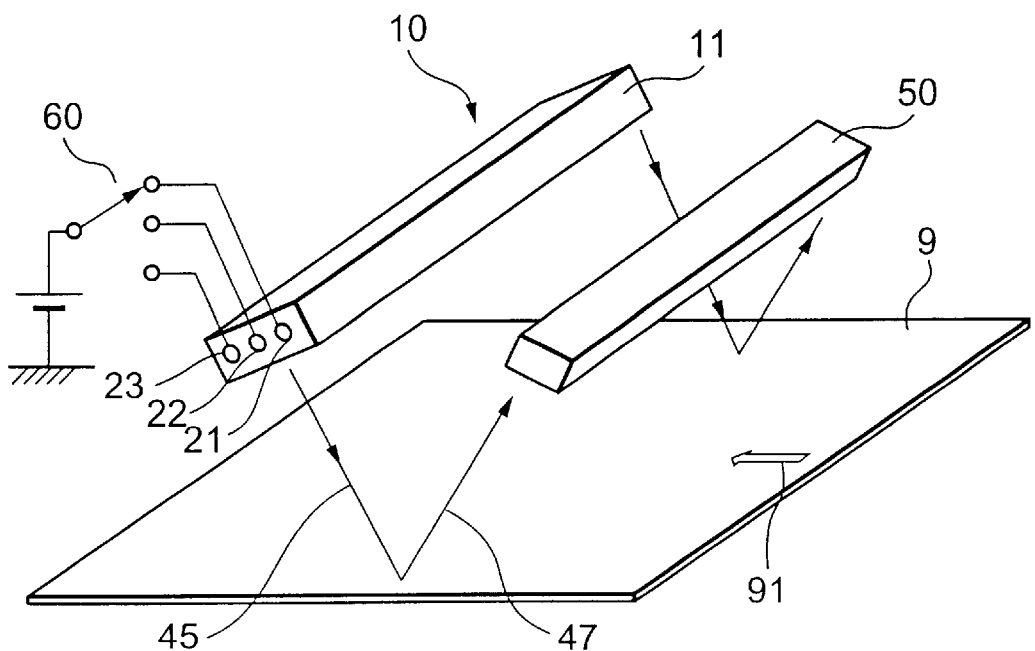
FIG. 1 is a schematic perspective view of a color image sensor employing a conventional linear illumination device having three primary color LED's as a point light source.
Figure 8:
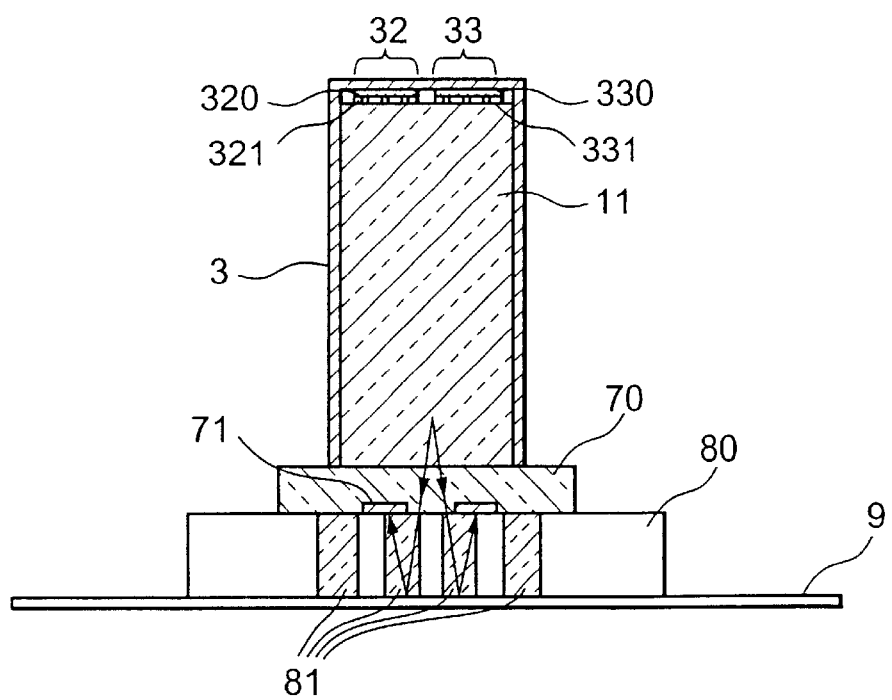
FIG. 8 is a schematic cross sectional view of a contact type image sensor integrated with the linear illumination device shown in FIG. 3.

FIG. 8 shows a construction of an integrated contact type image sensor, in which the linear illumination device shown in FIG. 1 is integrated with a contact type image sensor. In FIG. 8, the output light emitted from the lower surface of the optical waveguide member 11 illuminates an original 9 below an optical member 80 through a transparent substrate 70 having a thin film transistor (referred to as TFT, hereinafter) image sensor 71 and an optical waveguide member 81, such as glass fiber, of the optical member 80. Reflection light from the original 9 is received by the TFT image sensor 71 through the optical waveguide member 81 to read an image of the original.

With this construction, the integration of the contact type image sensor is facilitated, resulting in a compact and rigid color image sensor.

It should be noted that the constructive relation between the linear illumination device of the present invention and the line image sensor is not limited to the integrated construction shown in FIG. 8. For example, the construction shown FIG. 1 may be employed. Further, it is, of course, possible to collect light reflected from an original by means of a focusing lens and receive it by photo-diodes of such as a line sensor.

As described hereinbefore, according to the linear illumination device according to the present invention, in which an organic EL element is used to obtain blue color light, it is unnecessary to use the very expensive blue LED, so that it becomes possible to reduce the cost of the linear illumination device. Further, since the organic EL element emitting blue color light is relatively easily available, it is possible to obtain an inexpensive construction by combining an LED or LED's and an organic EL element or elements, as a light source.

Further, since the organic EL element is a surface emitting light source, it is possible to illuminate an object with highly uniform light from the organic EL element or elements. Although the red color LED is a point light source, it is possible to define the light emitting area to a point. Therefore, the design of the optical waveguide member for uniformly diffusing light to a linear light becomes substantially easier compared with the conventional design for uniformly diffusing lights having different wavelengths and the uniformity of illumination can be improved compared with the conventional case. Further, both the blue and green color lights may be emitted by the surface emitting light sources. Therefore, no unevenness of amount of light occurs due to the long linear optical waveguide member and a uniform illumination for an original as to be illuminated can be obtained. Consequently, the light amount of illumination is uniformed and it is possible to improve the quality of image taken in by converting a reflected light reflected by the original illuminated by the linear illumination device by means of an image sensor.

When the organic thin film EL element or elements are employed, it is possible to make the whole linear illumination device very compact with the aid of the thin film forming technology.

It is possible to obtain the three primary colors by organic EL elements. Unfortunately, however, there is no efficient organic EL material for red color found at present and the purity of color light obtained by the currently available organic EL material is low. Therefore, it is clear that the total efficiency of the linear illumination device and the image quality taken in when the EL element is used for red color light are substantially degraded compared with the linear illumination device employing the LED for red color light and that the linear illumination device according to the present invention has a structure, which can realize an improvement of the quality of image taken in and a reduction of cost of the linear illumination device.

What is claimed is:

1. A linear illumination device comprising:
    an optical waveguide member for guiding light incident on a first light incident surface of said optical waveguide member and emitting the light from a thin and long light emitting surface thereof, said light emitting surface being located so as to be opposed to said first light incident surface;
    a blue light source made of an electro luminescent element emitting blue color light as a surface emitting light source provided on a surface selected from said first light incident surface and a second light incident surface adjacent to a longer side of said light emitting surface;
    a red light source made of light emitting diode emitting red color light as a point light source provided on a surface selected from said first light incident surface and a third light incident surface adjacent to a shorter side of said light emitting surface; and
    a green light source emitting green color light provided on a surface selected from said first light incident surface, said third light incident surface and a fourth light incident surface opposing to said second light incident surface.

2. A linear illumination device as claimed in claim 1, wherein said green light source is made of a green light emitting diode as a point light source, and said green light source and said red light source are provided on said third light incident surface.

3. A linear illumination device as claimed in claim 1, wherein said green light source is made of a green light emitting diode as a point light source, and said green light source and said red light source are provided on said first light incident surface.

4. A linear illumination device as claimed in claim 1, wherein said green light source is made of an electro luminescent element emitting green color light as a surface emitting light source, and said green light source and said red light source are provided on said first light incident surface and said third light surface, respectively.

5. A linear illumination device as claimed in claim 1, wherein said green light source is made of an electro luminescent element emitting green color light as a surface emitting light source, and said green light source and said red light source are provided on said fourth light incident surface and said first light incident surface, respectively while said green light source is provided on said second light incident surface.

6. A linear illumination device as claimed in claim 1, wherein one side portion of said blue light source opposite to a light emitting surface thereof includes a light reflecting layer.

7. A linear illumination device as claimed in claim 3, wherein said red light source and said green light source are provided into a plurality of openings formed in said blue light source.

8. A linear illumination device as claimed in claim 7, wherein said red light source and said green light source include a plurality of light emitting diodes to provide a plurality of red light sources and green light sources such that said red light sources and green light sources are arranged alternately in a line in a lengthwise direction of said optical waveguide member.

9. A linear illumination device as claimed in claim 4, wherein back side electrodes of said green light source and said blue light source are formed of light reflecting material as a common electrode which is formed commonly on said first light incident surface, said second light incident surface and said fourth light incident surface.

10. A linear illumination device as claimed in claim 5, wherein back side electrodes of said green light source and said blue light source are formed of light reflecting material as a common electrode which is formed commonly on said first light incident surface, said second light incident surface and said fourth light incident surface.

11. A linear illumination device as claimed in claim 10, wherein said red light source is provided into an opening formed in said common electrode.

12. A linear illumination device as claimed in claim 1, wherein said blue light source is an organic thin film electro luminescent element including a transparent electrode on a side of said optical waveguide member, a metal electrode on an opposite side thereof and an organic thin film light emitting layer between said transparent electrode and said metal electrode.

13. A linear illumination device as claimed in claim 1, wherein said optical waveguide member has a rectangular parallelepiped configuration.

14. A linear illumination device comprising:
    an optical waveguide member for guiding light incident on a light incident surface of said optical waveguide member and emitting the light from a thin and long light emitting surface thereof, said optical waveguide member having a rectangular parallelepiped configuration;
    a point light source provided on said optical waveguide member for supplying light from said light incident surface into an interior of said optical waveguide member, said point light source including at least one light emitting diode; and
    a surface emitting light source provided on a surface portion of said optical waveguide member other than said light emitting surface for reflecting light from said point light source in said optical waveguide member back to said interior of said optical waveguide member, said surface emitting light source including at least one electro luminescent element comprising an organic thin film electro luminescent element including a transparent electrode on a side of said optical waveguide member, a metal electrode on an opposite side thereof and an organic thin film light emitting layer between said transparent electrode and said metal electrode.

15. A linear illumination device comprising:
    an optical waveguide member for guiding light incident on a light incident surface of said optical waveguide member and emitting the light from a thin and long light emitting surface thereof, said optical waveguide member having a rectangular parallelepiped configuration;
    a light emitting diode as a point light source provided on a surface of said optical waveguide member opposite to said light emitting surface thereof, and
    a pair of electro luminescent elements as surface emitting light sources provided on side surfaces of said optical waveguide member adjacent to a longer side of said light emitting surface thereof, respectively.

16. A linear illumination device as claimed in claim 15, wherein said light emitting diode emits red color light and said electro luminescent elements are provided on opposite side surfaces of said optical waveguide member as a blue color light emitting light source and a green color light emitting light source, respectively.

17. A linear illumination device as claimed in claim 16, wherein back side electrodes on said green color light emitting light source and said blue color light emitting light source are formed of a light reflecting material on a surface of said optical waveguide member opposite to said light emitting surface thereof and on side surfaces thereof adjacent to longer sides of said light emitting surface thereof.

* * * * *